(12) United States Patent
Ikarashi et al.

(10) Patent No.: US 8,072,789 B2
(45) Date of Patent: Dec. 6, 2011

(54) RESISTANCE-CHANGE MEMORY DEVICE

(75) Inventors: Minoru Ikarashi, Kanagawa (JP); Yutaka Higo, Kanagawa (JP); Masanori Hosomi, Kanagawa (JP); Hiroshi Kano, Kanagawa (JP); Shinichiro Kusunoki, Kanagawa (JP); Hiroyuki Ohmori, Kanagawa (JP); Yuki Oishi, Kanagawa (JP); Tetsuya Yamamoto, Kanagawa (JP); Kazutaka Yamane, Kanagawa (JP)

(73) Assignee: Sony Corporation, Tokyo (JP)

( * ) Notice: Subject to any disclaimer, the term of this patent is extended or adjusted under 35 U.S.C. 154(b) by 76 days.

(21) Appl. No.: 12/629,660

(22) Filed: Dec. 2, 2009

(65) Prior Publication Data

US 2010/0135068 A1   Jun. 3, 2010

(30) Foreign Application Priority Data

Dec. 3, 2008  (JP) ................................ 2008-309039

(51) Int. Cl.
*G11C 11/00* (2006.01)
*G11C 11/22* (2006.01)
*G11C 11/14* (2006.01)
*G11C 11/04* (2006.01)

(52) U.S. Cl. ......... 365/145; 365/158; 365/171; 365/130

(58) Field of Classification Search ................... 365/158
See application file for complete search history.

(56) References Cited

U.S. PATENT DOCUMENTS

| 5,695,864 A | 12/1997 | Slonczewski |
| 2003/0072174 A1 | 4/2003 | Savtchenko et al. |
| 2005/0141148 A1* | 6/2005 | Aikawa et al. ........... 360/324.11 |
| 2008/0180859 A1* | 7/2008 | Ueda et al. .................... 360/313 |
| 2010/0315864 A1* | 12/2010 | Ueda et al. .................... 365/158 |
| 2010/0315869 A1* | 12/2010 | Min et al. ....................... 365/171 |

FOREIGN PATENT DOCUMENTS

| JP | 10-116490 | 5/1998 |
| JP | 2001-156357 | 6/2001 |
| JP | 2005-277147 | 10/2005 |
| JP | 2007-317733 | 12/2007 |
| JP | 2008-186861 | 8/2008 |

OTHER PUBLICATIONS

Japanese Office Action for corresponding JP2008-309039 issued on Nov. 11, 2010.
J. Nahas et al., IEEE/ISSCC 2004 Visulas Supplement pp. 22.
J.Z. Sun, "Spin-current interaction with a monodomain magnetic body: A model study," Phys. Rev. B, vol. 62, No. 1, pp. 570-578, 2000.

(Continued)

*Primary Examiner* — Hoai V Ho
*Assistant Examiner* — Min Huang
(74) *Attorney, Agent, or Firm* — K&L Gates LLP

(57) ABSTRACT

A resistance-change memory device is provided and includes a stack constituting a tunnel magnetoresistance effect element that has a magnetic layer in which a direction of magnetization is switchable and that is formed on a conductive layer, and the stack is included in a resistance-change memory cell performing data writing utilizing a spin transfer effect caused by current injection. The stack is formed such that a line connecting centers of respective layers of the stack is tilted with respect to a direction perpendicular to a surface of the conductive layer having the stack formed thereon.

8 Claims, 9 Drawing Sheets

OTHER PUBLICATIONS

J.C. Slonczewski, "Current-driven excitation of magnetic multilayers," Journal of Magnetism and Magnetic Materials, 159, L1-L7, 1996.

Y. Suzuki et al., "Theory and experiments on the spin-transfer magnetization reversal," The 134th Topycal Symposium of The Magnetics Society of Japan, pp. 53-62, 2004.

M.R. Gibbons, "Micromagnetic Simulation using the dynamic alternating direction implicit method", J. Magn. Magn. Mater., 186, pp. 389 (1998).

Y.B. Bazaliy, et al., "Modification of the Landau-Lifshitz equation in the presence of a spin-polarized current in Colossal-and giant' Magnetoresistive Materials", PRB 57, pp. R3213(1998).

* cited by examiner

RESISTANCE-CHANGE MEMORY DEVICE

CROSS REFERENCES TO RELATED APPLICATIONS

The present application claims priority to Japanese Priority Patent Application JP 2008-309039 filed in the Japan Patent Office on Dec. 3, 2008, the entire content of which is hereby incorporated by reference.

BACKGROUND

The present disclosure relates to a resistance-change memory device in which data is written using a spin transfer effect caused by current injection.

In accordance with the recent significant widespread use of data communication apparatuses, in particular, small personal apparatuses such as mobile terminals, there has been a demand for memories, logic devices, and the like constituting these apparatuses to have higher performance including a higher degree of integration, a higher speed, and lower power consumption. In particular, nonvolatile memories are considered to be indispensable components for realizing high performance apparatuses.

Semiconductor flash memories and ferroelectric nonvolatile memories (FeRAMs) have been put to practical use as such nonvolatile memories. At present, active research and development activities are underway to achieve even higher performance.

Recently, magnetic random access memories (MRAMs) utilizing a tunnel magnetoresistance effect have significantly advanced through extensive development, and have drawn much attention as a new type of nonvolatile memory that uses a magnetic material (see, for example, J. Nahas et al., IEEE/ISSCC 2004 Visulas Supplement, p. 22).

Here, the principle of operation of an MRAM, which is closely related to the present invention is briefly described.

An MRAM is a magnetic data storage device having a structure provided with regularly arranged minute memory elements made of a magnetic material and wiring arranged so as to allow access to each of the memory elements.

When currents are passed through both a conductor line (word line) and a read conductor line (bit line) arranged above or below the magnetic memory elements, a combined current magnetic field is induced. Writing of data into an MRAM is performed by controlling the magnetization of each magnetic element using the combined current magnetic field.

Generally, "0" or "1" is stored in accordance with the direction of magnetization. Typical methods of rewriting the data in a memory element include a method utilizing asteroid characteristics (see, for example, Japanese Unexamined Patent Application Publication No. 10-116490). There also exists a method utilizing switching characteristics (see, for example, U.S. Patent Application Publication No. 2003/0072174).

Reading of data is performed by selecting a particular memory cell via a device such as a transistor and obtaining information about the direction of magnetization as a voltage signal utilizing a galvanomagnetic effect.

A memory cell structure which has been proposed is a structure including a three-layer junction (magnetic tunnel junction: MTJ) having a ferromagnetic layer, an insulating layer, and a ferromagnetic layer. This structure is called an MTJ structure hereinafter.

In an MTJ structure, one ferromagnetic layer is used as a fixed reference layer having a fixed magnetization direction, and the other as a recording layer (free layer). In this manner, the magnetization direction of the recording layer is made to correspond to a voltage signal utilizing the tunnel magnetoresistance effect, in an MTJ structure.

An MRAM allows "0" and "1" data based on switching of the polarity of magnetic material to be rewritten at high speed and almost an infinite number of times ($10^{15}$ times or more). This is the primary feature of an MRAM compared with other nonvolatile memories.

On the other hand, substantial power is necessary in an MRAM because a current of several to several tens of mA is passed through the wiring. In addition, miniaturization of the memory cells is difficult because both word lines for recording and read lines for reading are necessary in an MRAM. Furthermore, when the MTJ is decreased in size, a stronger magnetic field is necessary for switching in an MRAM, and hence, resulting in a disadvantage in terms of scaling for miniaturization from the viewpoint of power consumption.

As one solution, research has been conducted regarding a recording method that does not use a current magnetic field, and research on spin transfer switching, among others, is ongoing (see, for example, U.S. Pat. No. 5,695,864).

A memory element using spin transfer switching employs an MTJ structure similarly to an MRAM. However, spin transfer switching utilizes the fact that spin polarized electrons passing through a magnetic layer having a certain fixed magnetization direction exert torque on a free layer when the electrons enter the free layer. Specifically, the magnetization of the free layer switches when a current equal to or more than a threshold is passed.

Writing of "0" or "1" is controlled by changing the polarity of the current.

The absolute value of a current necessary for this switching is several mA or less for an element that is on a scale of about 0.1 μm, and moreover, decreases with the volume of the element. In this respect, a spin transfer switching memory element has an advantage in terms of decreasing the scale of an element.

In addition, a spin transfer switching memory element has an advantage in that the memory cell is simplified because the word lines for recording necessary in an MRAM are not necessary.

In reading of data, the tunnel magnetoresistance effect is used similarly to MRAM.

Hereinafter, an MRAM utilizing spin transfer switching is called a spin transfer random access memory (SpRAM). Likewise, a spin-polarized electron flow causing spin transfer is called a spin injection current.

An SpRAM is considered to be a highly promising nonvolatile memory which realizes lower power consumption and larger capacity while keeping the advantages of MRAM in terms of high speed and being able to be subjected to an almost infinite number of rewriting operations.

In an already proposed SpRAM, data rewriting between "0" and "1" is performed by changing the polarity of a spin injection current.

However, the result of magnetic polarity switching may not necessarily be determined only by the polarity of the spin injection current due to instability involved in the spin transfer switching phenomenon.

In an SpRAM, in addition to the magnetization states respectively corresponding to "0" and "1" data, there exists a quasi-stable state observed only when a spin injection current is caused to flow. This instability in the magnetization switching result is caused by a phenomenon in which once the magnetization is trapped in the quasi-stable state, the magnetization state after the current is stopped becomes unstable.

SUMMARY

The present embodiment provides a resistance-change memory device configured to perform stable magnetization switching over a wide range of injection currents.

A resistance-change memory device according to a first embodiment includes a stack constituting a tunnel magnetoresistance effect element that has a magnetic layer in which a direction of magnetization is switchable and that is formed on a conductive layer, and the stack is included in a resistance-change memory cell performing data writing utilizing a spin transfer effect caused by current injection. The stack is formed such that a line connecting centers of respective layers of the stack is tilted with respect to a direction perpendicular to a surface of the conductive layer having the stack formed thereon.

In the stack constituting a tunnel magnetoresistance effect element having the structure described above, a current flows in the stacking direction (direction of the stack thickness) in accordance with an applied voltage. In a usual stack, i.e., when the line connecting the centers of the respective layers of the stack is parallel to the stacking direction, the direction of the flowing current is nearly the same as the stacking direction.

On the other hand, when the line connecting the centers of the respective layers of the stack is tilted with respect to a direction perpendicular to the layer surface (surface of the underlying conductive layer), as described above, the direction of the current vector is also tilted accordingly.

In such a configuration, when the current vector is tilted, a current component in a certain specific direction generates an internal magnetic field which prevents magnetization utilized for memory from being oriented in a direction in which a quasi-stable state exists. In other words, when a current component in a certain specific direction is generated by the tilted current vector, transition to a quasi-stable state is prevented in accordance with the magnitude of the current component.

A resistance-change memory device according to a second embodiment includes a stack constituting a tunnel magnetoresistance effect element that includes a magnetic layer in which a direction of magnetization is switchable and that is formed between a first conductive layer and a second conductive layer, and the stack is included in a resistance-change memory cell performing data writing utilizing a spin transfer effect caused by current injection. The stack is formed such that a contact surface between the stack and the first conductive layer is arranged at a position displaced from a position at which a contact surface between the stack and the second conductive layer is arranged, in a direction perpendicular to the switching direction of magnetization.

In the resistance-change memory device according to the second embodiment, the current vector is made to tilt similarly to the first feature.

In the second embodiment, in particular, the two contact surfaces respectively corresponding to the entrance and exit for the current are arranged so as to be tilted, thereby making the general current path be tilted. The resultant specific current component works to prevent transition to a quasi-stable state.

In the first and second embodiments described above, it is desirable that portions of the stack other than the magnetic tunnel junction structure have cross-sectional areas which are different between one side and the other side of the magnetic tunnel junction structure in the stacking direction.

According to the embodiments, a resistance-change memory device configured to be capable of performing stable magnetization switching over a wide range of injection current is provided.

Additional features and advantages are described herein, and will be apparent from the following Detailed Description and the figures.

DETAILED DESCRIPTION

Hereinafter, embodiments are described taking an SpRAM as an example with reference to the attached drawings.

First, the cross-sectional element structure and phenomenon common to first to third more detailed embodiments described below are described.

Cross-Sectional Element Structure Common to Embodiments

Figure 1:
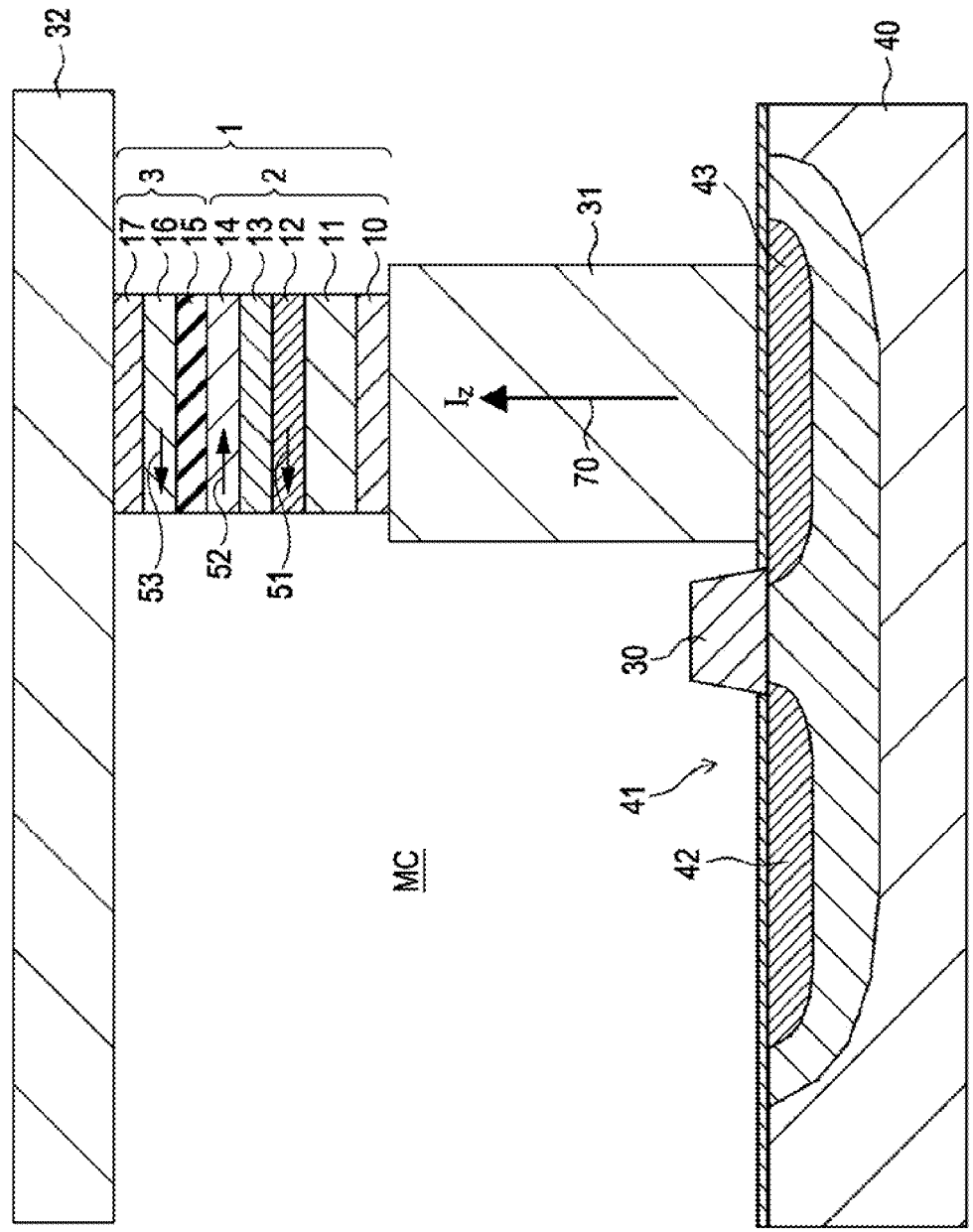
FIG. 1 is a schematic cross-sectional view of a memory cell of an SpRAM according to a comparative example.

FIG. 1, which relates to a comparative example to which the present invention is not applied, is a schematic cross-sectional view of a memory cell MC of an SpRAM that performs data switching between "0" and "1" using a spin injection current.

In the memory cell MC shown in FIG. 1, a tunnel magnetoresistance effect element 1 and a selection element are connected in series between a bit line 32 constituted of an upper layer wiring line and a source line (not shown).

The selection element is an element that electrically selects a memory cell for reading and writing, and may be realized by a diode, a MOS transistor, or the like. FIG. 1 illustrates an example in which a MOS transistor (selection transistor 41) is used as the selection transistor.

On a Si substrate 40, diffusion layers 42 and 43 of the selection transistor 41 are formed in such a manner as to be apart from each other and to sandwich therebetween a region where a channel is formed. The diffusion layers 42 and 43 are doped so as to be of a conductivity type opposite to that of the channel forming region, and are made to be low-resistance layers. The diffusion layer 42 is connected to a source line at a position not shown.

The diffusion layer 43 is connected to one end (lower end) of the tunnel magnetoresistance effect element 1 via a connection plug 31.

The other end (upper end) of the tunnel magnetoresistance effect element 1 is connected to a bit line 32. The gate of the selection transistor 41 has a stack structure including a thin gate insulating layer (not shown) and a gate conductive layer. The gate conductive layer functions as a selection signal line 30 or is connected to another selection signal line 30.

The tunnel magnetoresistance effect element 1 includes a memory layer 16 whose magnetization direction is relatively easily rotatable and fixed-magnetization layers 12 and 14.

The memory layer 16 and the fixed-magnetization layers 12 and 14 are made of, for example, nickel (Ni), iron (Fe), or cobalt (Co); or a ferromagnetic material mainly made of an alloy thereof.

The memory layer 16 may be formed of a plurality of magnetic layers, and these may be called a free layer 3 as a whole. In the example illustrated in FIG. 1, the free layer 3 includes a tunnel barrier layer 15, the memory layer 16, and a nonmagnetic layer 17 in this order from the bottom layer.

The fixed-magnetization layers 12 and 14 are antiferromagnetically coupled to each other via a nonmagnetic layer 13, and the fixed-magnetization layer 12 is formed in contact with an antiferromagnetic layer 11. These layers have strong one-direction magnetic anisotropy due to exchange interaction generated therebetween, and may be also called a fixed layer 2 as a whole. In the example illustrated in FIG. 1, the fixed layer 2 includes an underlying film 10, the antiferromagnetic layer 11, the fixed-magnetization layer 12, the nonmagnetic layer 13, and the fixed-magnetization layer 14 in this order from the bottom layer.

Examples of the materials used for the nonmagnetic layer 13 and a nonmagnetic layer 17 include tantalum (Ta), copper (Cr), and ruthenium (Ru). In a steady state, magnetization 51 of the fixed-magnetization layer 12 and magnetization (hereinafter, called reference layer magnetization) 52 of the fixed-magnetization layer 14 are in a nearly completely antiparallel state due to strong antiferromagnetic coupling therebetween via the nonmagnetic layer 13.

Usually, the fixed-magnetization layer 12 and the fixed-magnetization layer 14 have the same value of the product of the saturation magnetization and layer thickness, and the leakage components of the magnetic pole magnetic field is negligibly small.

Examples of the materials which may be used for antiferromagnetic layers include manganese base alloys of iron (Fe), nickel (Ni), platinum (Pt), iridium (Ir), rhodium (Rh), and the like; cobalt (Co); and nickel oxide.

The tunnel barrier layer 15 constituted of the oxide of, for example, aluminum (Al), magnesium (Mg), or Silicon (Si); or an insulator constituted of nitride or the like is provided between the memory layer 16 and the fixed-magnetization layer 14 is provided. The tunnel barrier layer 15 plays the role of cutting the magnetic coupling between the memory layer 16 and the fixed-magnetization layer 14, and the role of passing a tunnel current.

These magnetic layers and conductive layers are formed by mainly using a sputtering method, and the tunnel barrier layer may be obtained by oxidizing or azotizing a metal film formed by sputtering.

The nonmagnetic layer 17 is a topcoat film and plays the role of preventing mutual diffusion and decreasing contact resistance between the tunnel magnetoresistance effect element 1 and a wiring line used for connection of the tunnel magnetoresistance effect element 1, and also plays the role of preventing the oxidization of the memory layer 16. Materials which may be usually used for the topcoat film include copper (Cu), tantalum (Ta), and titanium nitride.

The underlying film 10 works to enhance the crystallizability of layers stacked thereabove. Materials which may be used for the underlying film 10 include chrome (Cr) and tantalum (Ta).

The state of a memory cell can be determined on the basis of whether magnetization 53 (hereinafter, called memory layer magnetization 53) of the memory layer 16 is in a state of being parallel or antiparallel with magnetization 52 (hereinafter, called reference layer magnetization 52) of the fixed-magnetization layer 14.

It is necessary to pass a spin injection current 70 ($I_z$) in order to read the state of a memory cell or to rewrite the memory cell.

The spin injection current 70 flows through the diffusion layer 43, the tunnel magnetoresistance effect element 1, and the bit line 32.

Figure 2:
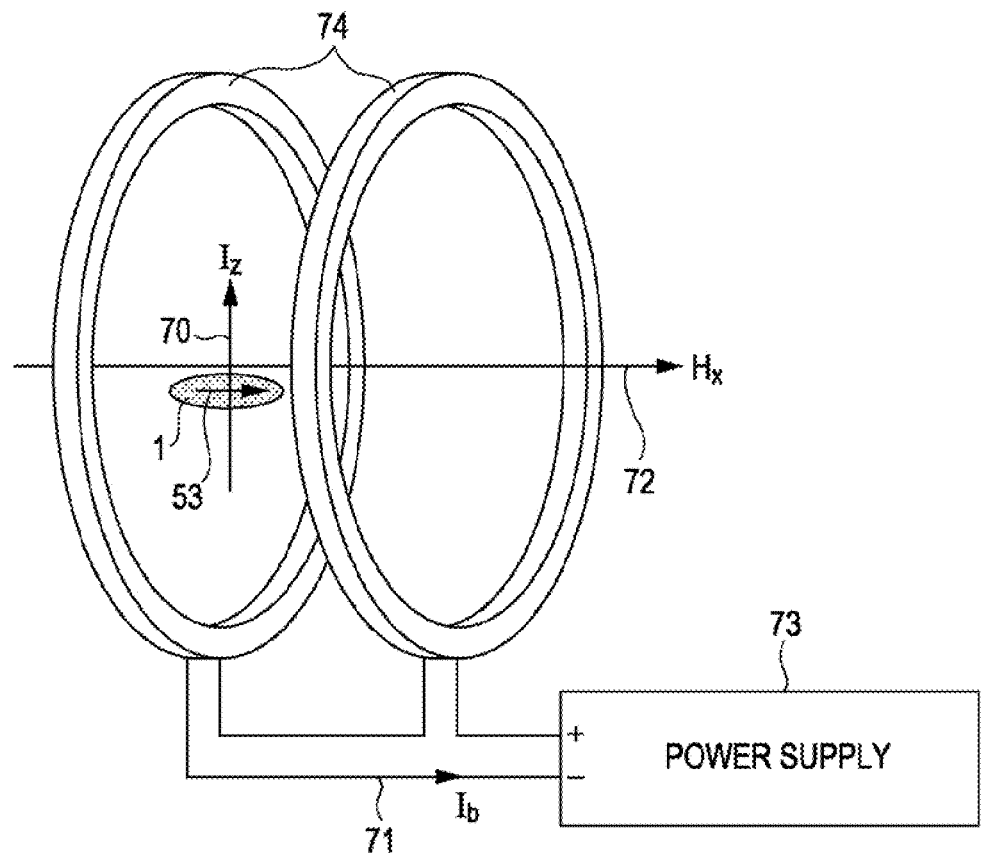
FIG. 2 illustrates an apparatus for measuring the characteristics of SpRAM usable in embodiments.

FIG. 2 illustrates an apparatus for measuring the characteristics of an SpRAM.

The switching of the memory layer magnetization 53, between "0" and "1" data, of the tunnel magnetoresistance effect element 1 can be also performed by using a bias current magnetic field 72 ($H_X$) in addition to the spin injection current 70 ($I_z$).

A state diagram of a memory cell with the vertical axis representing the pulse wave height of the spin injection current 70 and the horizontal axis representing the pulse wave height of the bias current magnetic field 72 is called a phase diagram.

The apparatus illustrated in FIG. 2 uses Helmholtz coils 74 to generate the bias current magnetic field 72. A bias current 71 ($I_b$) flowing through the Helmholtz coils 74 is independently provided from an external power supply 73. The spin injection current 70 flows out of or into a separate drive circuit via the bit line 32 connected to a memory cell.

By using the apparatus illustrated in FIG. 2, measurement for creating a phase diagram can be made by setting the magnitudes and phases of the spin injection current 70 and the bias current magnetic field 72 at any values.

Figure 3:
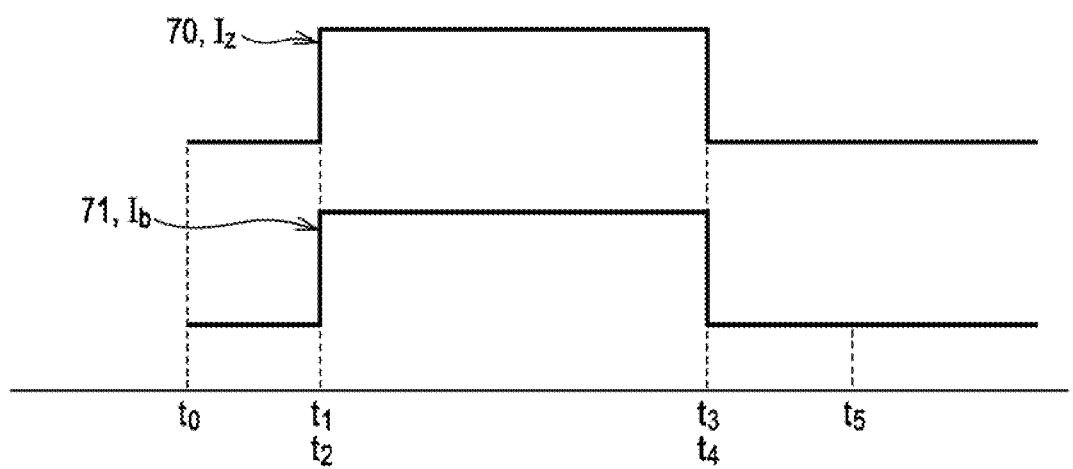
FIG. 3 is a diagram illustrating timing of applying a spin injection current pulse and a bias current pulse in measurements of the embodiments.

FIG. 3 is a diagram illustrating the timing of applying the pulses of the spin injection current 70 ($I_z$) and the bias current 71 ($I_b$). The initial state is denoted by $t_0$. For simplicity, both of the spin injection current 70 and the bias current 71 are assumed to be constituted of square pulses. The spin injection current 70 and the bias current 71 rise respectively at time $t_1$ and time $t_2$. The spin injection current 70 and the bias current 71 fall respectively at time $t_3$ and time $t_4$.

At time $t_5$, the resistance state determined by the angle between the memory layer magnetization 53 and the reference layer magnetization 52 is read and the end state is determined.

Figure 4:
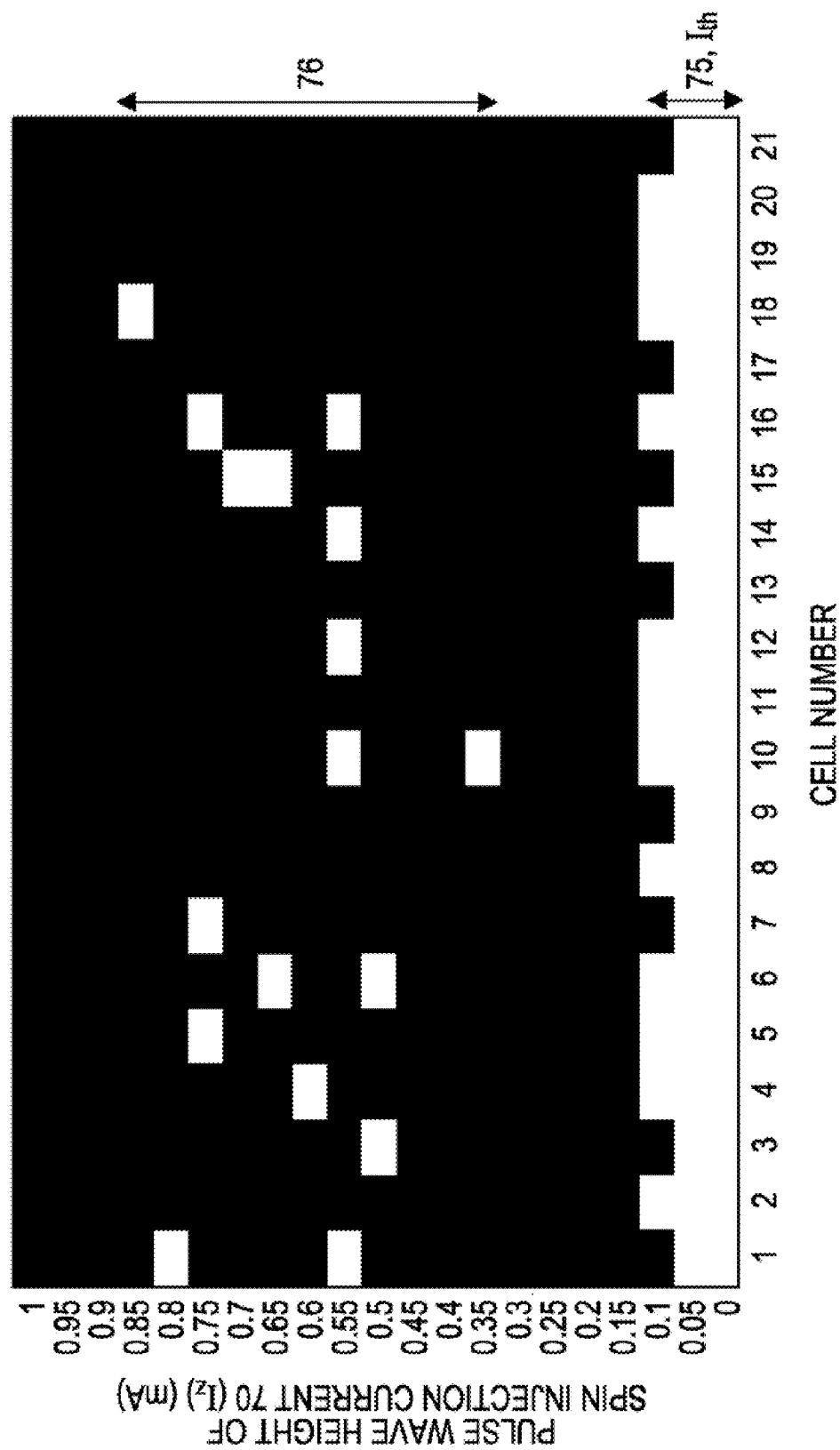
FIG. 4 is a memory cell state diagram of an SpRAM according to the comparative example for a pulse duration of 10 ns.

FIG. 4 illustrates a memory cell state diagram of an SpRAM to which the present invention is not applied, for a pulse duration of 10 ns. The memory cell state diagram illustrates the correlation between the spin injection current and the memory cell state with the vertical axis representing the pulse wave height of the spin injection current 70 ($I_z$) and the horizontal axis representing the addresses of memory cells.

In the initial state before passing a spin injection current, the memory layer magnetization 53 and the reference layer magnetization 52 are, for example, arranged so as to be antiparallel with each other in accordance with the polarity of the bias current magnetic field 72.

The memory cell state in the memory cell state diagram means the final state reached as a result of magnetization switching.

In MRAM including SpRAM, storage of data "0" and "1" utilizes the two clear and stable magnetization states, and hence, it is not desirable that an unstable state exists where it is not clear which of data "0" or "1" is stored.

In the case where a spin transfer torque does not exist, for example, in an MRAM to which the present invention is not applied, a stable magnetization state corresponds to a potential energy valley of the memory layer magnetization 53.

Description of Phenomenon Common to Embodiments

Torque from an effective magnetic field acting on memory layer magnetization is given by Equation (1), according to the following document: M. R. Gibbons, "Micromagnetic Simulation using the dynamic alternating direction implicit method", J. Magn. Mater., 186, pp. 389 (1998).

$$\vec{T}_{eff} = M_s \vec{m} \times \vec{H}_{eff} \qquad (1)$$

Here, $M_s$, denotes the saturation magnetization of the memory layer 16, $\vec{m}$ denotes the unit magnetization vector of the memory layer magnetization 53, and $\vec{H}_{eff}$ denotes an effective magnetic field vector acting on the memory layer magnetization 53.

The effective magnetic field has the following relation with potential energy.

$$\vec{H}_{eff} = -\frac{1}{M_s} \frac{\partial U}{\partial \vec{m}} \qquad (2)$$

The potential energy is expressed by the following Equation (3).

$$U = -\frac{1}{2} M_s H_k (\vec{m} \cdot \vec{e})^2 - \frac{1}{2} M_s (\vec{m} \cdot \vec{H}_d) - M_s (\vec{m} \cdot \vec{H}) \qquad (3)$$

Here, $H_k$ denotes the anisotropy magnetization of the memory layer 16, $\vec{e}$ denotes the easy magnetization axis, $\vec{H}_d$ denotes an antimagnetic vector acting on the memory layer magnetization 53, and $\vec{H}$ denotes an external vector.

When a memory element is placed within the apparatus illustrated in FIG. 2, the external magnetic field is the sum of the injection current magnetic field and the bias current magnetic field.

In the element structure illustrated in FIG. 1, a magnetic field generated by a current flowing through the tunnel magnetoresistance effect element 1 and the connection plug 31 is an eddy magnetic field, and hence, does not have the effect of uniformly aligning the magnetization directions.

Japanese Unexamined Patent Application Publication No. 2005-277147 discloses an invention in which a magnetic field generated by an injection current flowing through the bit line 32 is caused to act on the memory layer magnetization.

The torque from the effective magnetic flux continues to act until the final stage of the system converges to the potential energy valley. When the memory layer magnetization is in a state of uniform magnetization, there are two potential energy valleys: one is a state in which the memory layer magnetization 53 and the reference layer magnetization 52 are parallel, and the other is a state in which the memory layer magnetization 53 and the reference layer magnetization 52 are antiprallel.

Hence, by externally applying a current magnetic field or the like, it is possible to move the initial state to an unstable energy state and then cause the final stage to settle in a state opposite to the initial state.

However, in the case of an SpRAM, there exists a quasi-stable state that is observed only when a spin injection current is passed, in addition to the magnetization states corresponding to "0" and "1" data, and once the magnetization is trapped in the quasi-stable state, the magnetization state after the current is stopped may become unstable on rare occasions.

The torque (spin transfer torque) transmitted from spin polarized electrons is given by Equation (4), according to the following document: Y. B. Bazaliy, et al., "Modification of the Landau-Lifshitz equation in the presence of a spin-polarized current in Colossal- and giant-Magnetoresistive Materials", PRB 57, pp. R3213 (1998).

$$\vec{T}_{spin} = M_s \vec{m} \times \vec{H}_{spin} \qquad (4)$$

Here, $M_s$, denotes the saturation magnetization of the memory layer 16, $\vec{m}$ denotes the unit magnetization vector of the memory layer magnetization 53, and $\vec{H}_{spin}$ denotes a spin transfer magnetic field vector acting on the memory layer magnetization 53.

The spin transfer magnetic field and the kinetic energy K of the conduction electrons have the relation expressed by Equation (5).

$$\vec{H}_{spin} = -\frac{1}{M_s} \frac{\partial K}{\partial \vec{m}} \qquad (5)$$

The kinetic energy of the conduction electrons is given by the following Equation (6).

$$K = -\frac{1}{c} \vec{J} \cdot \vec{A} \qquad (6)$$

Here, $\vec{J}$ denotes a spin injection current density vector and $\vec{A}$ denotes virtual vector potential that the conduction electrons receive in the memory layer. $\vec{A}$ is proportional to a change in the angular momentum.

As illustrated in FIG. 1, when the injection current density vector is oriented in a direction perpendicular to the planar surface ($J_x=J_y=0$, $J_z \neq 0$), the kinetic energy valley of the conduction electrons is also oriented in a direction perpendicular to the planar surface.

The kinetic energy valley is stable only in a state where the injection current is passed, and hence, considered to be a quasi-stable state.

In an SpRAM, the kinetic energy valley of the conduction electrons is oriented in a direction different from that of the magnetization potential energy valley. For this reason, it may occur on rare occasions that once the magnetization is trapped in a quasi-stable state during the course of transition, the final stage becomes independent of the initial state.

Referring to FIG. 4, it is reflected in an unstable region 76 that the magnetization has been trapped in a quasi-stable state during the course of transition.

Figure 5A:
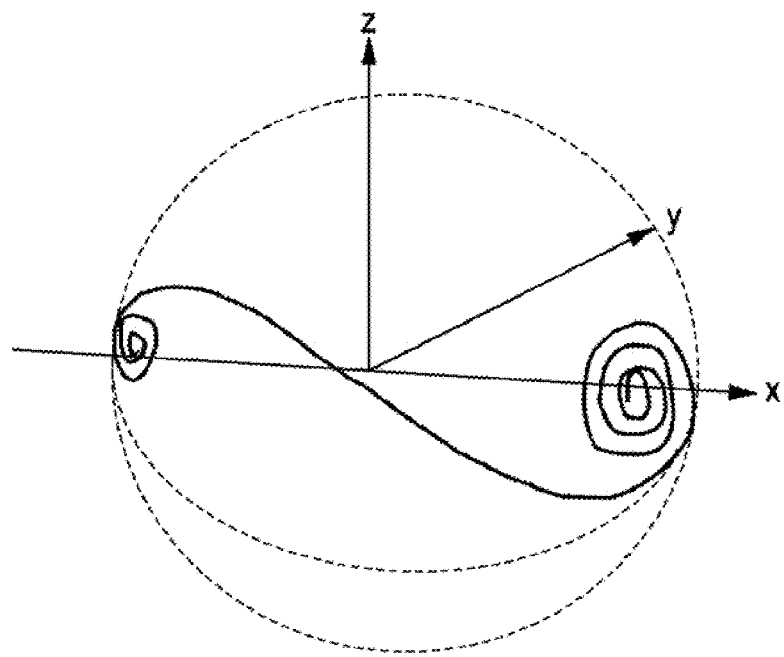
FIGS. 5A and 5B are diagrams respectively illustrating magnetization transition processes in the case where magnetization switching is performed normally and in the case where magnetization switching is not performed normally.

FIG. 5A is a schematic diagram illustrating the process of magnetization transition in the case of normal magnetization switching. It is assumed that, in the initial state, the memory layer magnetization 53 is oriented in the +x direction, and the reference layer magnetization 52 is oriented in the −x direction. When the spin injection current 70 having a value higher than a threshold is passed, the magnetization, while precessing around the x axis, eventually switches to the −x direction. This is the case where there exist two stable states, i.e., an antiparallel state ("0" state) and a parallel state ("1" state), and shows that passing a current higher than a threshold current 75 ($I_{th}$) allows switching from one state to the other state.

Figure 5B:
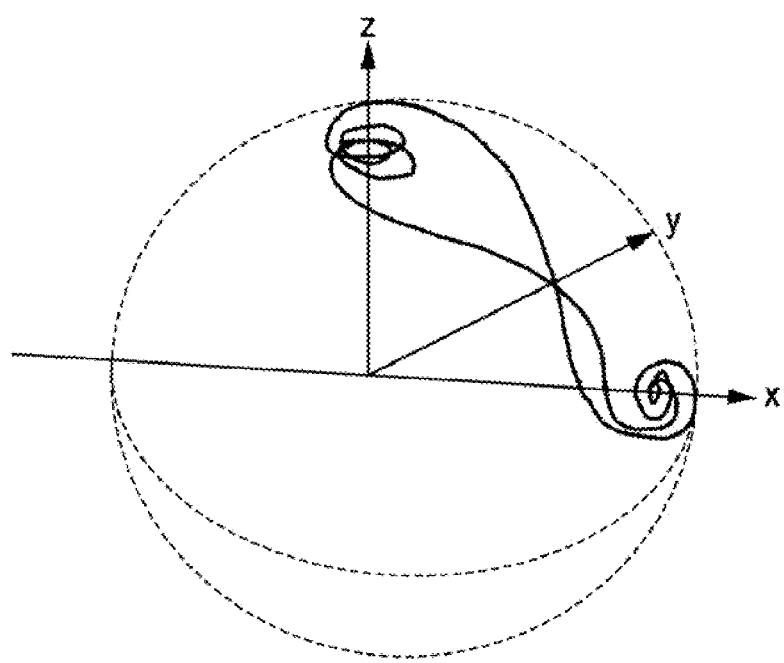

FIG. 5B is a schematic diagram illustrating the process of magnetization transition in the case where magnetization switching is not performed normally. It is assumed that, in the initial state, the memory layer magnetization 53 is oriented in the +x direction, and the reference layer magnetization 52 is oriented in the −x direction. When the spin injection current 70 having a value higher than a threshold is passed, the magnetization precesses around the x axis, but the precession changes to precession around the z axis. This is because the precession around the z axis exists as a quasi-stable state. This phenomenon is observed on rare occasions when the kinetic energy of the conduction electrons exceeds the potential energy of the magnetization.

The quasi-stable state can exist only when the conduction electrons have kinetic energy, in other words, only during a period when the spin injection current 70 is flowing. Hence, after the current is caused to stop flowing, the state may become either "0" or "1".

FIG. 5B shows that since the magnetization has been trapped in a quasi-stable state, the state returns to the initial magnetization state after the current is stopped.

The above-described phenomenon, in which the magnetization state becomes unstable, will lower the reliability of writing data in an SpRAM.

Some errors in writing may be recovered by an error correction circuit; however this will result in an increase in chip area due to additional necessary circuits and an increase in power consumption.

Furthermore, as long as such an unstable state exists, it is difficult to use an SpRAM as a main memory. This will significantly lower the value of SpRAMs as nonvolatile memories for increasing the performance of data apparatuses.

First Embodiment

In an SpRAM, there occurs a transition from the post-switching state to a state which is different from the intended state because a quasi-stable state temporarily generated by passing the spin injection current 70 disturbs the intended transition path.

Without changing the structure illustrated in FIG. 1, it is difficult to completely prevent the temporary generation of the quasi-stable state, as long as the spin transfer magnetization rotation principle is used.

However, if the direction (z axis direction in FIG. 5B) in which the quasi-stable state exists is clearly known, it is possible to optimize the direction in which the injection current is passed such that the memory layer magnetization 53 will not face in the direction of the quasi-stable state.

Figure 6:
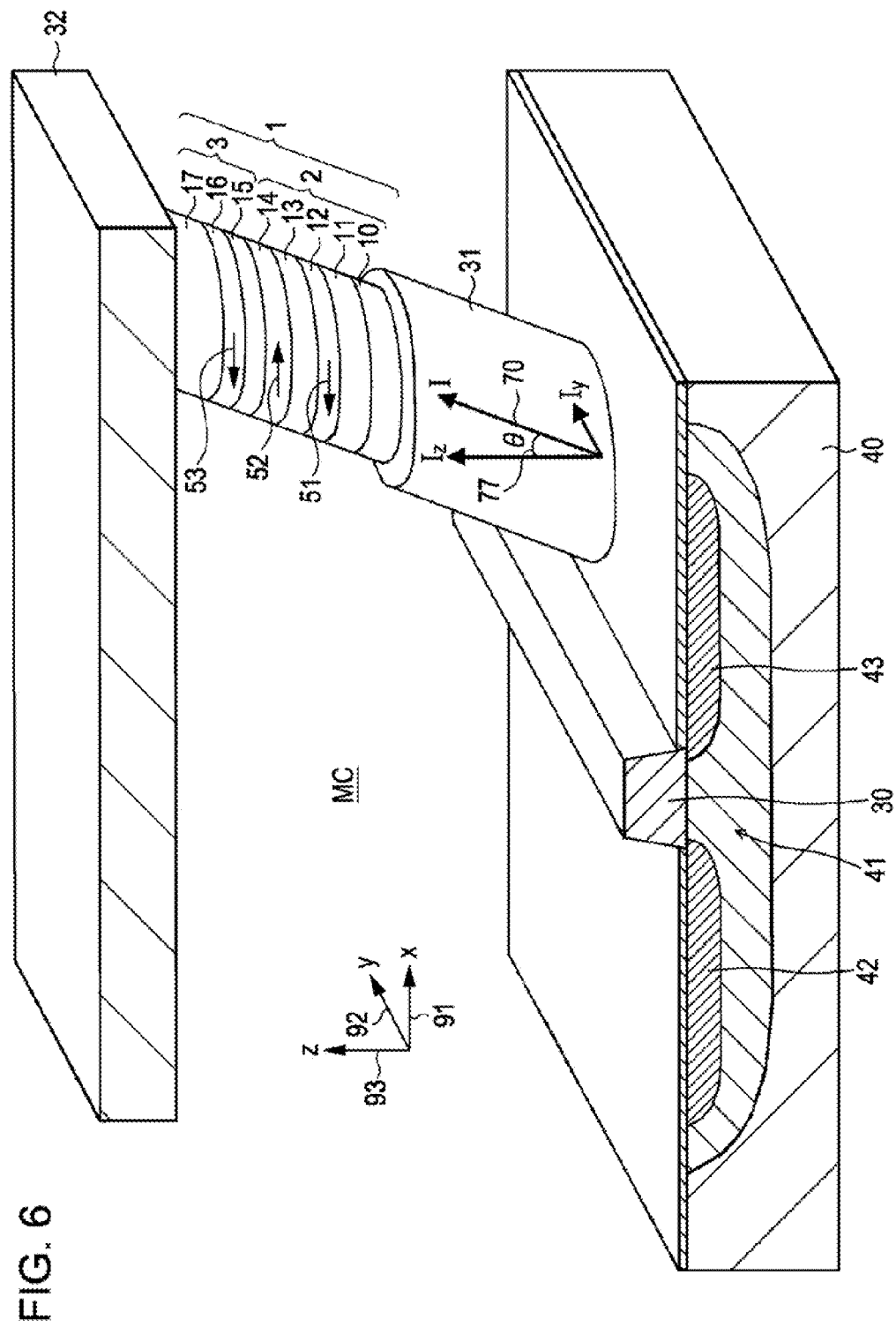
FIG. 6 is a schematic cross-sectional view of a memory cell of an SpRAM according to a first embodiment.

FIG. 6 is a schematic cross-sectional view of an SpRAM according to a first embodiment.

A virtual vector potential $\vec{A}$ acting on conduction electrons includes a component $A_x$ or $A_y$ which is parallel to the planar surface in addition to a vertical component $A_z$. Hence, by making the tunnel magnetoresistance effect element 1 and the connection plug 31 be tilted, a current density vector is made to have an induced component ($J_x$ or $J_y$) which is parallel to the planar surface, thereby allowing the kinetic energy valley of the conduction electrons to be moved to a direction different from a direction perpendicular to the planar surface.

When the kinetic energy valley of the conduction electrons faces in a direction other than the direction perpendicular to the planar surface (to be precise, the upper surface of the connection plug 31 on which the tunnel magnetoresistance effect element 1 is formed), the probability that the memory layer magnetization 53 faces in the vertical direction and enters a quasi-stable state is significantly decreased. The probability of transition to a quasi-stable state decreases as a current vector component (current component $I_y$ in FIG. 6) perpendicular to the x direction (switching direction of magnetization) preferably increases, among the current density vector components parallel to the planar surface. A decrease in the probability of entering a quasi-stable state will prevent the magnetization transition result from becoming unstable and will remove the unstable region.

According to detailed studies, it is desirable that an angle 77 at which the tunnel magnetoresistance effect element 1 and the connection plug 31 are tilted with respect to a surface (the upper surface of the connection plug 31 in the present embodiment) parallel to the planar surface is in the range of from 5 to 85 degrees.

Figure 7:
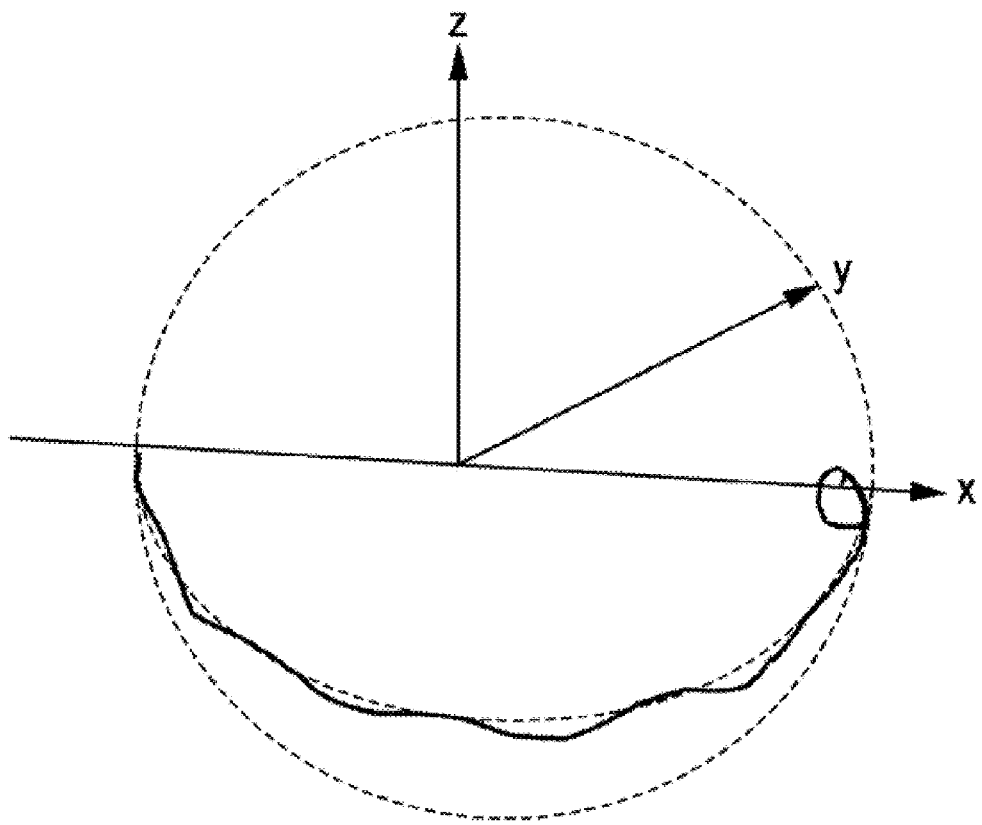
FIG. 7 is a schematic diagram illustrating a magnetization transition process in the case where magnetization is normally performed in the first embodiment.

FIG. 7 is a schematic diagram illustrating a magnetization transition process in the case where magnetization is normally performed in the first embodiment.

It is assumed that, in the initial state, the memory layer magnetization 53 is oriented in the +x direction, and the reference layer magnetization 52 is oriented in the −x direction. By tilting the tunnel magnetoresistance effect element 1 and the connection plug 31, the transition of the memory layer magnetization 53 ends without the magnetization facing in a direction where a quasi-stable state exists.

Figure 8:
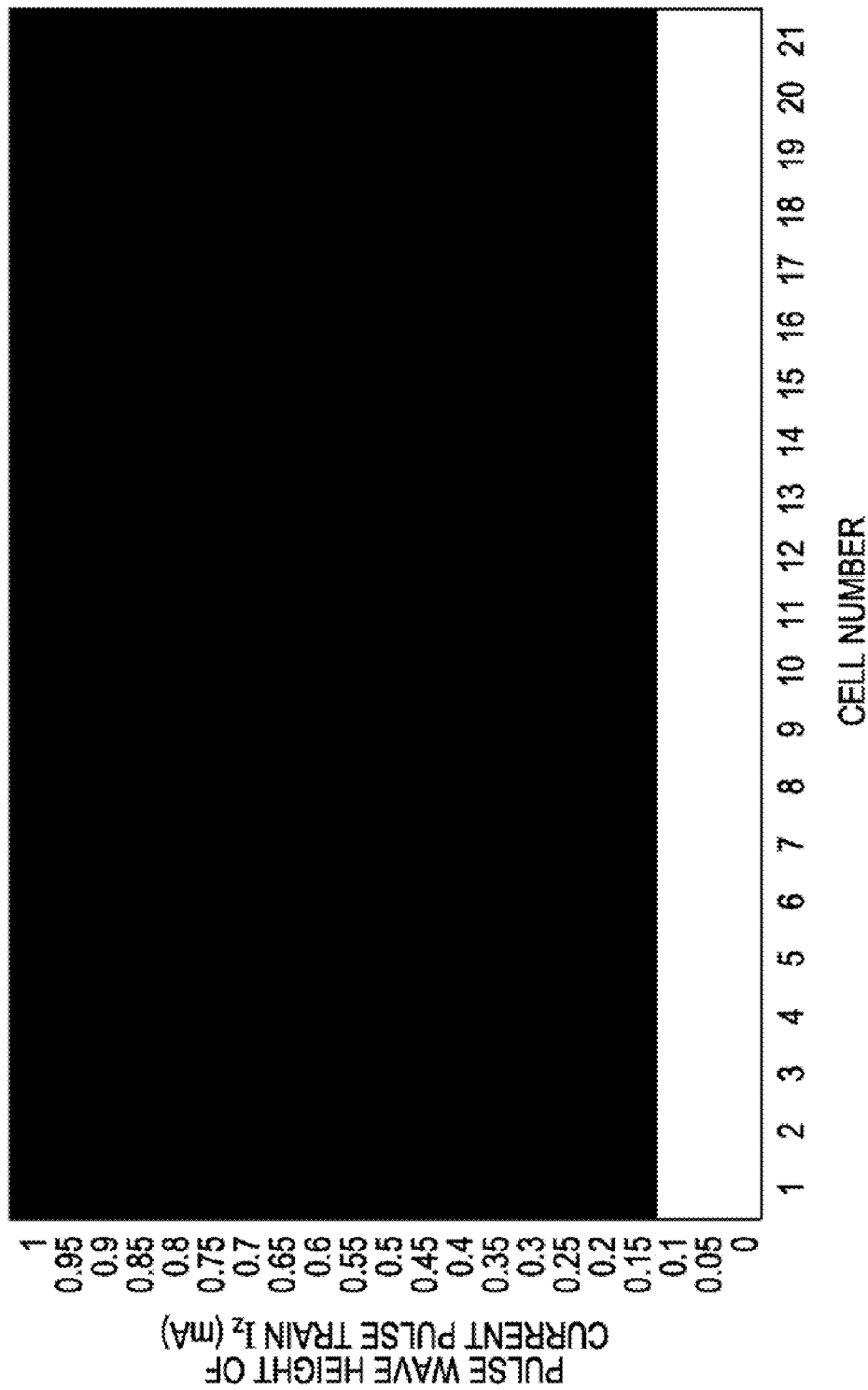
FIG. 8 is a memory cell state diagram in the first embodiment for a current pulse train in which the total of a pulse duration and a waiting time is 10 ns.

FIG. 8 illustrates a memory cell state diagram in the first embodiment for a current pulse train in which the total of a pulse duration and a waiting time is 10 ns. The memory cell state diagram is illustrated with the vertical axis representing the pulse wave height ($I_z$) of the current pulse train and the horizontal axis representing the addresses of memory cells.

The angle 77 at which the tunnel magnetoresistance effect element 1 and the connection plug 31 are tilted is about 30 degrees. In this case, the states in which the switching result become unstable, as illustrated in FIG. 4, have been completely removed by moving the kinetic energy valley.

In addition, as a byproduct of making the tunnel magnetoresistance effect element 1 and the connection plug 31 be tilted, it becomes possible to cause the current magnetic field generated by the spin injection current 70 flowing through the tunnel magnetoresistance effect element 1 and the connection plug 31 to be applied to the memory layer magnetization 53. To enhance this effect, it is desirable to adjust the cross-sectional area such that there exists a difference between the current density before passing through the tunnel magnetoresistance effect element 1 and the current density after passing therethrough.

To realize the structure illustrated in FIG. 6, for example, a tilted hole is made in an embedded insulating layer by angled etching, and a plug material is filled into this hole to form the connection plug 31. Then, respective layers constituting the tunnel magnetoresistance effect element 1 are formed in contact with the upper surface of the connection plug 31 on the embedded insulating layer.

Then, after forming a mask layer of a resist or the like, the respective layers constituting the tunnel magnetoresistance effect element 1 are sequentially removed by angled etching in the area surrounding the mask layer.

Finally, the mask layer is removed to complete the formation of the stack of the tilted connection plug 31 and tunnel magnetoresistance effect element 1 illustrated in FIG. 6. Note that the other portions such as a transistor and wiring are formed using a usual method.

Note that FIG. 6 illustrates an in-plane magnetization MTJ.

In the present embodiment, "switching direction of magnetization" means the direction of the easy magnetization axis, and this direction corresponds to the direction of an x axis 91.

A "direction perpendicular to the switching direction of magnetization" corresponds to the direction of a y axis 92.

When it is stated that "the line connecting the centers of the respective layers of the stack constituting the tunnel magnetoresistance effect element 1 is tilted", the reference (a direction with a tilt of zero) is the direction of a z axis 93, which is perpendicular to the upper surface (surface having the stack formed thereon) of the connection plug 31.

Referring to FIG. 6, in the tunnel magnetoresistance effect element 1 having an in-plane magnetization MTJ, it is desirable that the dimensions of the shape of each layer constituting the MTJ are different between a direction in which magnetization is easy (easy magnetization direction) and a direction, in the plane of the magnetic layer, perpendicular to the easy magnetization direction. Hence, in the example illustrated in FIG. 6, each layer constituting the MTJ has the shape of an elliptical plane, for example.

More specifically, in FIG. 6, one thing determining the easiness of magnetization is the shape of the ellipse. The magnetization is easily stabilized in the direction of the major axis (direction of the x axis 91). On the other hand, the magnetization is not stable in the direction of the minor axis (direction of the y axis 92). Hence, the switching direction of magnetization is set to the direction of the x axis 91.

Second Embodiment

In an SpRAM, there occurs a transition from the post-switching state to a state which is different from the intended state because a quasi-stable state temporarily generated by passing the spin injection current 70 disturbs the intended transition path.

Without changing the structure illustrated in FIG. 1, it is difficult to completely prevent the temporary generation of the quasi-stable state, as long as the spin transfer magnetization rotation principle is used.

However, if the direction (z axis direction in FIG. 5B) in which the quasi-stable state exists is clearly known, it is possible to optimize the stacking direction of the tunnel magnetoresistance effect element 1 such that the memory layer magnetization 53 will not face in the direction of the quasi-stable state.

Figure 9:
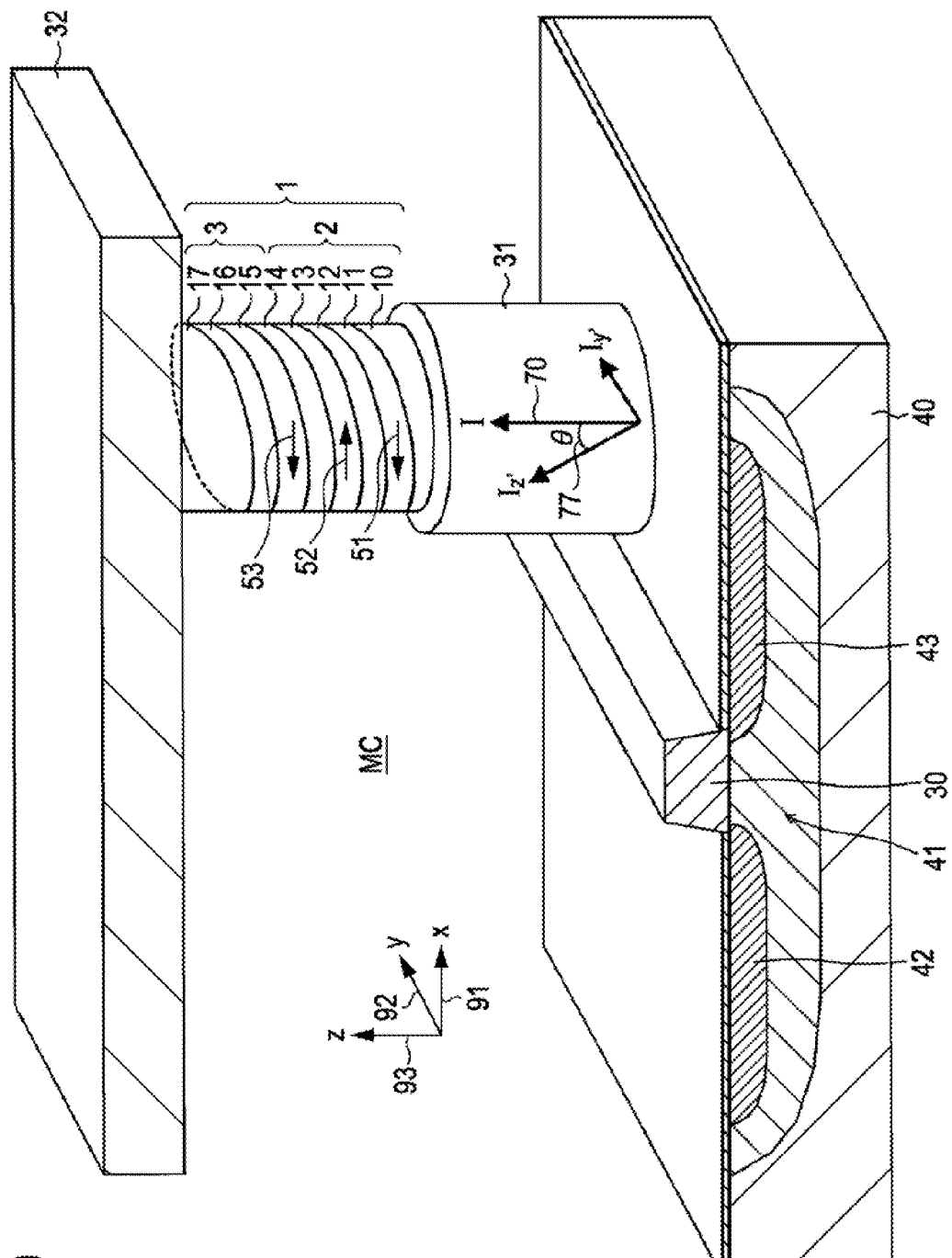
FIG. 9 is a schematic cross-sectional view of an SpRAM according to a second embodiment.

FIG. 9 is a schematic cross-sectional view of an SpRAM according to a second embodiment.

A virtual vector potential $\vec{A}$ acting on conduction electrons includes a component $A_x$ or $A_y$ which is parallel to the planar surface in addition to a vertical component $A_z$. Hence, by making the planes of the tunnel magnetoresistance effect element 1 be inclined, a current density vector is made to have an induced component ($J_x$ or $J_y$) which is parallel to the planar surface, thereby allowing the kinetic energy valley of the conduction electrons to be moved to a direction different from a direction perpendicular to the planar surface.

When the kinetic energy valley of the conduction electrons faces in a direction other than the direction perpendicular to the planar surface (to be precise, the upper surface of the connection plug 31 on which the tunnel magnetoresistance effect element 1 is formed), the probability that the memory layer magnetization 53 faces in the vertical direction and enters a quasi-stable state is significantly decreased. A decrease in the probability of entering a quasi-stable state will prevent the magnetization transition result from becoming unstable and will remove the unstable region.

According to detailed studies it is desirable that an angle 77 at which the planes of the tunnel magnetoresistance effect element 1 are inclined with respect to a surface (the upper surface of the connection plug 31 in the present embodiment) parallel to the planar surface is in the range of from 5 to 85 degrees.

The magnetization transition process obtained in the case where magnetization is normally performed is similar to that illustrated by the schematic diagram of FIG. 7 according to the first embodiment.

Referring to FIG. 7, it is assumed that, in the initial state, the memory layer magnetization 53 is oriented in the +x direction, and the reference layer magnetization 52 is oriented in the −x direction. By making the tunnel magnetoresistance effect element 1 form inclined planes, the transition of the memory layer magnetization 53 ends without the magnetization facing in a direction where a quasi-stable state exists.

The obtained memory cell state diagram for a current pulse train in which the total of a pulse duration and a waiting time is 10 ns is the same as that illustrated in FIG. 8 according to the first embodiment. Referring to FIG. 8, the memory cell state diagram is illustrated with the vertical axis representing the pulse wave height of the current pulse train and the horizontal axis representing the addresses of memory cells. The angle 77 at which the planes of the tunnel magnetoresistance effect element 1 are inclined is about 30 degrees.

The states in which the switching result becomes unstable, as illustrated in FIG. 4, have been completely removed by moving the kinetic energy valley.

In addition, as a byproduct of making the planes of the tunnel magnetoresistance effect element 1 inclined, it becomes possible to cause the current magnetic field generated by the spin injection current 70 flowing through the tunnel magnetoresistance effect element 1 to be applied to the memory layer magnetization 53. To enhance this effect, it is desirable to adjust the cross-sectional area such that there exists a difference between the current density before passing through the tunnel magnetoresistance effect element 1 and the current density after passing therethrough.

As illustrated in FIG. 9, it is necessary to form the tunnel magnetoresistance effect element 1 such that each layer is inclined with respect to the upper surface of the connection plug 31 which is nearly parallel to the planar surface. When angled etching is used as described in the first embodiment, the tunnel magnetoresistance effect element 1 which is tilted is formed on the upper surface of the straight connection plug 31, as illustrated in FIG. 6. Although this structure is acceptable, the following method may be used to realize the structure illustrated in FIG. 9.

An underlying film 10 is formed such that the upper surface is inclined with respect to the horizontal surface even though the lower surface in contact with the upper surface of the connection plug 31 is horizontal.

An example processing method of realizing the underlying film 10 having such a structure includes making the amount of light passing through a photo mask gradually decrease with respect to the transcription plane of a certain pattern, by appropriately designing the photo mask.

By using such an appropriately designed photo mask, the cross-sectional shape of the resist after exposure becomes the same as the shape of the underlying film 10 in which only the upper surface is inclined, as illustrated in FIG. 9. As this resist is continued to be etched back under the condition of a relatively low selection ratio with respect to the material of the underlying film, the underlying film is etched gradually deeper from one end to the other end during the course of the resist being removed. Eventually, the underlying film is patterned as illustrated by the underlying film 10 in which the shape of the resist is reflected.

When the rest of the layers constituting the fixed layer 2 and the layers of the free layer 3 are sequentially formed on the underlying film 10 and patterned, the tunnel magnetoresistance effect element 1, illustrated in FIG. 9, is realized.

Third Embodiment

Figure 10:
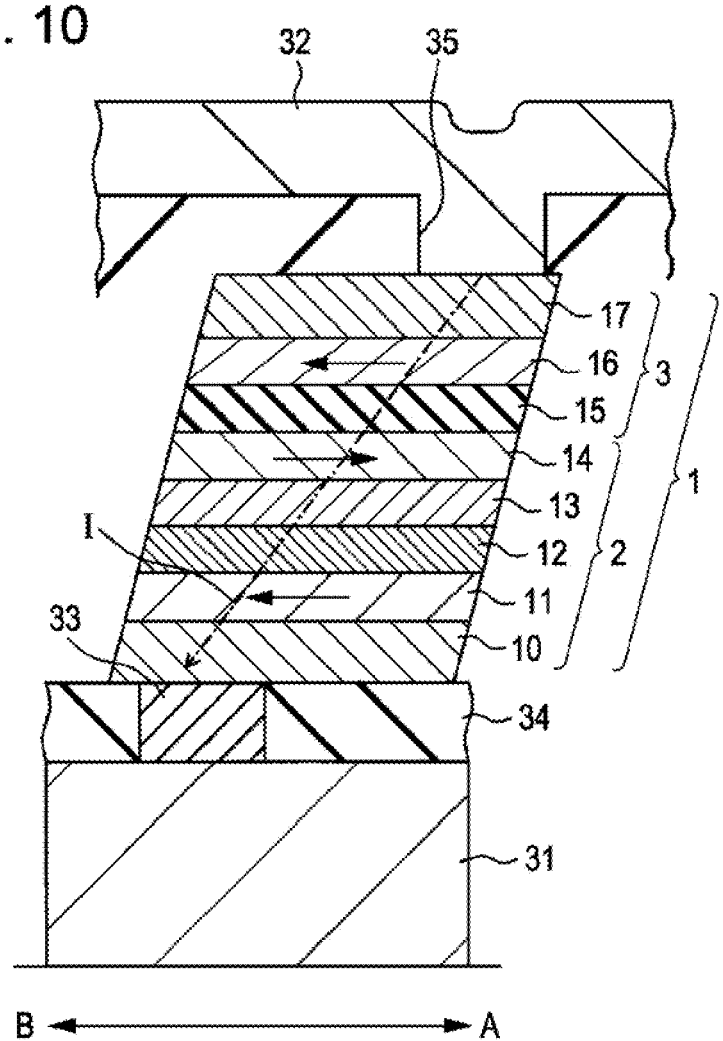
FIG. 10 is a schematic cross-sectional view of a memory cell of an SpRAM according to a third embodiment.

Referring to FIG. 10, before forming a tunnel magnetoresistance effect element 1, a conductive layer 33 restricting a current path and an insulating layer 34 surrounding the conductive layer 33 are formed. Then, by the processing method described above, the tunnel magnetoresistance effect element 1 is formed on the insulating layer 34 having the conductive layer 33 embedded therein, in such a manner as to be tilted.

In FIG. 10, the direction toward which the tunnel magnetoresistance effect element 1 is tilted is denoted by "A", and a direction opposite to the direction A is denoted by "B".

Referring to FIG. 10, the tunnel magnetoresistance effect element 1 is formed on the conductive layer 33 such that the conductive layer 33 is in contact with the lower surface of the tunnel magnetoresistance effect element 1 at a position displaced from the center of the lower surface of the tunnel magnetoresistance effect element 1 in the direction B.

Then, when a bit line 32 is formed, an opening 35 which is narrower than the upper surface of the tunnel magnetoresistance effect element 1 is formed in the uppermost layer of a flattening layer, in which the tunnel magnetoresistance effect element 1 is to be embedded, in such a manner as to restrict the current path. The bit line 32 is electrically connected to the tunnel magnetoresistance effect element 1 via the opening 35.

The opening 35 is positioned apart from the center of the upper surface of the tunnel magnetoresistance effect element 1 in the direction A, which is the direction toward which the tunnel magnetoresistance effect element 1 is tilted. Hence, the average direction of the current is tilted by being regulated by the conductive layer 33 and the opening 35.

This arrangement of the conductive layer 33 and the opening 35 strengthens the effect of forming the tunnel magnetoresistance effect element 1 so as to be tilted, i.e., the effect of preventing the transition to a quasi-stable state. Hence, a memory with a smaller error rate is realized.

Note that if this arrangement of the conductive layer 33 and the opening 35 has a sufficient effect, it may not be necessary to make the tunnel magnetoresistance effect element 1 be tilted. Such a structure is also included in the present third embodiment. In addition, the structure in which the conductive layer 33 and the opening 35 are arranged so as to be displaced from each other may also be applied to the second embodiment.

Fourth Embodiment

Figure 11:
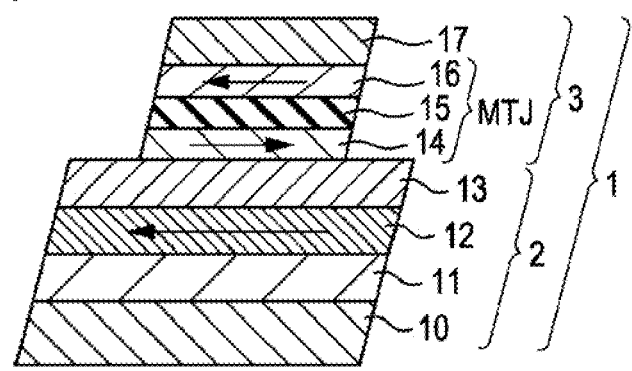
FIG. 11 is a schematic cross-sectional view of a memory cell of an SpRAM according to a fourth embodiment.

Referring to FIG. 11, an effect of enhancing the effect of the first embodiment is also obtained by changing the cross-sectional areas of one side and the other side of the stack in the stacking direction, with respect to the MTJ structure constituted of the fixed-magnetization layer 14, the tunnel barrier layer 15, and the memory layer 16.

This is because a current component inducing an internal magnetic field that prevents the transition to a quasi-stable state is generated in such a manner that the magnitude is proportional to the cross-sectional area. In other words, the larger the imbalance in the current components between above and below the MTJ structure, the stronger the internal magnetic field that prevents the transition to a quasi-stable state.

Such a stack having different cross-sectional areas may be formed by forming the tunnel magnetoresistance effect element 1 using two kinds of etching with different sizes of process patterns.

Note that this assisting effect of preventing the transition to a quasi-stable state by changing the sizes of cross-sectional areas assumes that there exists a current component that generates an internal magnetic field preventing the transition to a quasi-stable state. Hence, changing the size of a cross-sectional area is not effective by itself, and is effective in embodiments such as the present embodiment in which this configuration is combined with the first or second embodiment. Furthermore, this configuration is applicable to the third embodiment and may be combined with any other embodiments.

In the first to fourth embodiments described above, a tunnel magnetoresistance effect element having an in-plane magnetization MTJ is used as an example. However, this may be changed to a tunnel magnetoresistance effect element 1 having a vertical magnetization MTJ, in which the direction of magnetization is a direction (normal line direction) perpendicular to the respective layers of the stack constituting the MTJ. Also in this case, "the line connecting the centers of the respective layers of the stack is tilted from (and with respect to) the direction perpendicular to the surface of the conductive layer on which the stack is formed". However, the easy magnetization direction (direction of the easy magnetization axis) is the z axis 93. When the MTJ stack is tilted with respect to a direction perpendicular to the direction of the easy magnetization axis, for example, the y axis 92, the effect that the probability of transition to a quasi-stable state is decreased is obtained similarly to the above-described in-plane magnetization case.

According to the first to fourth embodiments described above in detail, the instability involved in spin transfer magnetization switching is removed, and memory cells are allowed to perform "0" and "1" data switching with high reliability. This realizes miniaturization, higher reliability, larger capacity, and lower power consumption in an SpRAM.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A resistance-change memory device comprising:
    a stack constituting a tunnel magnetoresistance effect element that includes a magnetic layer in which a direction of magnetization is switchable and that is formed on a conductive layer, the stack being included in a resistance-change memory cell performing data writing utilizing a spin transfer effect caused by current injection,
    wherein the stack is formed such that a line connecting each of the centers of respective layers of the stack is tilted with respect to a direction perpendicular to a surface of the conductive layer having the stack formed thereon.

2. The resistance-change memory device according to claim 1, wherein the stack is formed such that the line connecting the centers of the respective layers of the stack is tilted with respect to the direction perpendicular to the surface of the conductive layer having the stack formed thereon at an angle ranging from 5 to 85 degrees.

3. The resistance-change memory device according to claim 1, wherein the stack is formed such that the line connecting the centers of the respective layers of the stack is tilted, with respect to the direction perpendicular to the surface of the conductive layer having the stack formed thereon, toward a direction perpendicular to a switching direction of magnetization.

4. The resistance-change memory device according to claim 1,
wherein the stack is formed between a first conductive layer and a second conductive layer, and
wherein the stack is formed such that a contact surface between the stack and the first conductive layer is arranged at a position displaced from a position at which a contact surface between the stack and the second conductive layer is arranged, in a direction perpendicular to the switching direction of magnetization.

5. The resistance-change memory device according to claim 1,
wherein the stack includes a magnetic tunnel junction structure constituted of an insulating layer and two ferromagnetic layers sandwiching the insulating layer therebetween, and
wherein portions of the stack other than the magnetic tunnel junction structure have cross-sectional areas on one side and the other side of the magnetic tunnel junction structure in a stacking direction different from each other.

6. The resistance-change memory device according to claim 5,
wherein the cross-sectional area of a portion of the stack on a side where a current is injected into the magnetic tunnel junction structure is smaller than the cross-sectional area of a portion of the stack on a side receiving the current from the magnetic tunnel junction structure.

7. A resistance-change memory device comprising:
a stack constituting a tunnel magnetoresistance effect element that includes a magnetic layer in which a direction of magnetization is switchable and that is formed between a first conductive layer and a second conductive layer, the stack being included in a resistance-change memory cell performing data writing utilizing a spin transfer effect caused by current injection,
wherein the stack is formed such that a contact surface between the stack and the first conductive layer is arranged at a position displaced from a position at which a contact surface between the stack and the second conductive layer is arranged, in a direction perpendicular to the switching direction of magnetization, and
wherein at least a portion of an outer surface of the stack is tilted with respect to a direction perpendicular to a surface of the conductive layer having the stack formed thereon.

8. The resistance-change memory device according to claim 7,
wherein the cross-sectional area of a portion of the stack on a side where a current is injected into the magnetic tunnel junction structure is smaller than the cross-sectional area of a portion of the stack on a side receiving the current from the magnetic tunnel junction structure.

* * * * *